(12) United States Patent
Funaki

(10) Patent No.: US 6,937,522 B2
(45) Date of Patent: Aug. 30, 2005

(54) NONVOLATILE SEMICONDUCTOR MEMORY DEVICE

(75) Inventor: Toshihiko Funaki, Kanagawa (JP)

(73) Assignee: NEC Electronics Corporation, Kawasaki (JP)

(*) Notice: Subject to any disclaimer, the term of this patent is extended or adjusted under 35 U.S.C. 154(b) by 14 days.

(21) Appl. No.: 10/773,909

(22) Filed: Feb. 5, 2004

(65) Prior Publication Data

US 2004/0156239 A1 Aug. 12, 2004

(30) Foreign Application Priority Data

Feb. 7, 2003 (JP) ........................................ 2003-031483

(51) Int. Cl.[7] .............................................. G11C 16/06
(52) U.S. Cl. .......................... 365/185.22; 365/185.23; 365/189.07
(58) Field of Search ...................... 365/185.22, 185.23, 365/189.07, 226, 185.24

(56) References Cited

U.S. PATENT DOCUMENTS 5,754,469 A * 5/1998 Hung et al. ............. 365/185.03
6,452,837 B2 * 9/2002 Mori et al. ............. 365/185.24
6,606,266 B2 * 8/2003 Tsuruda ................. 365/185.03
6,714,455 B2 * 3/2004 Banks .................... 365/185.22

FOREIGN PATENT DOCUMENTS

| JP | 4-057294 | 2/1992 |
| JP | 9-198882 | 7/1997 |
| JP | 10-305482 | 11/1998 |

* cited by examiner

Primary Examiner—Son T. Dinh
(74) Attorney, Agent, or Firm—Katten Muchin Rosenman LLP

(57) ABSTRACT

In writing N level of multilevel data to nonvolatile semiconductor memory by repeating a verification process, a verification result of a memory cell where the Nth threshold level which is the highest level is to be written as an expected level is invalidated until completion of writing to a memory cell where the (N−1)th and lower level is to be written. The verification result of the memory cell where the Nth level is to be written is validated after reaching the (N−1)th write level. A reference current supplied to a sense amplifier corresponding to the Nth level is set at at least a level allowing no indeterminate sensing of a sense amplifier. In verification of the Nth level data, a word line voltage supplied for verify-reading is raised from $V_W 1$ to $V_W 2$.

18 Claims, 9 Drawing Sheets

FIG. 2A

OPERATION IN CMP

|  | COMPARISON RESULT | |
|---|---|---|
| WRITE LEVEL OF EXPECTED LEVEL DATA > WRITE LEVEL OF READ DATA | FAIL | "L" |
| WRITE LEVEL OF EXPECTED LEVEL DATA ≤ WRITE LEVEL OF READ DATA | PASS | "H" |

FIG. 2B

WORD VOLTAGE SELECTION OPERATION IN CTL

|  | WORD VOLTAGE SELECTION SIGNAL | |
|---|---|---|
| EXPECTED LEVEL DATA LVN AND READ DATA FROM MEMORY CELL NOT REACHING LVN-1, OR EXPECTED LEVEL DATA LV2 TO LVN-1 | LEVEL INDICATING Vw1 | "L" |
| EXPECTED LEVEL DATA LVN AND READ DATA FROM MEMORY CELL REACHING LVN-1, OR EXPECTED LEVEL DATA LV1 | LEVEL INDICATING Vw2 | "H" |

FIG. 2C

VERIFICATION RESULT SELECTION OPERATION IN CTL

|  | MUX SELECTION SIGNAL |
|---|---|
| CELL WITH WORD VOLTAGE Vw1 AND EXPECTED LEVEL LVN-1 OR LOWER | COMPARISON RESULT IN CMP |
| CELL WITH WORD VOLTAGE Vw1 AND EXPECTED LEVEL LVN | FAIL |
| ALL CELL WITH WORD VOLTAGE Vw2 | COMPARISON RESULT IN CMP |

NONVOLATILE SEMICONDUCTOR MEMORY DEVICE

BACKGROUND OF THE INVENTION

1. Field of the Invention

The present invention relates to reprogrammable nonvolatile semiconductor memory devices such as EPROM and EEPROM, and more particularly, to a method for writing data to a multilevel cell able to store more than one bit of information in a single memory cell.

2. Related Background Art

A multilevel data storage nonvolatile semiconductor memory device which can store three or more levels of data (for example, four-level data: "00", "01", "10", and "11") in a single memory cell (EEPROM with NOR cell architecture) as a means to increase data density of reprogrammable nonvolatile semiconductor memory such as EPROM and EEPROM are disclosed in Japanese Unexamined Patent Application Publication No. H04-57294 and H10-302482, for example.

Data writing to the multilevel nonvolatile semiconductor memory employing a data readout system that performs batch verification of N (N≧3) level data is generally performed as follows. Initially, a write operation that injects electrons into a floating gate is performed on a memory cell for a given period of time (about several hundreds of seconds). Next, a read operation for verification, which is referred to hereinafter as a verify-read operation, is performed.

Then, a compare operation is performed to compare a data level read out by the verify-read operation with a data level (expected level) to be written, thereby determining whether the threshold level of the memory cell that has been written exceeds the write level corresponding to the expected level. For the memory cell where the threshold level does not exceed the write level corresponding to the expected level and thus a verification result is "FAIL", the write operation is performed again for a given period of time.

In this manner, a cycle of the write operation, verify-read operation, and compare operation is repeated until the written threshold level of the memory cell exceeds the write level corresponding to the expected level. Once the threshold level exceeds the write level, that is, the verification results in "PASS", the write operation is no longer performed on this memory cell. The writing in the nonvolatile semiconductor memory device is completed when the write level corresponding to the expected level is reached in all the memory cells.

Referring first to FIG. 6, it schematically shows the $I_D$-$V_G$ characteristics of a programmable nonvolatile semiconductor memory cell changing during the writing of one of four-level (two-bit) data to the cell. The diagram shows the $I_D$-$V_G$ characteristics when data is erased with a solid line. After the write operation to the memory cell is started, the $I_D$-$V_G$ characteristics changes so that the threshold level increases each time the writing (electron injection into the floating gate) is performed as shown with dotted lines. Thus, the enhancement state of the memory cell changes accordingly.

After the each writing to the nonvolatile semiconductor memory cell, the gate voltage is changed into a word voltage $V_W1$ for the read operation to read the write level LV of each memory cell. The write operation to the cell stops at the point when the read level reaches the write level corresponding to the expected level of this memory cell, which is, the point when the read current level exceeds the write level corresponding to the expected level indicated by a circle in FIG. 6. Desired data writing is thereby achieved.

In the case where the expected levels for the four levels ("11", "10", "01", and "00") stored in a plurality of nonvolatile semiconductor memory cells connected to a single word line are $LV_1$, $LV_2$, $LV_3$, and $LV_4$, if the write operation is performed per word line, the writing to the cell for storing the data "11" is completed first and no writing is performed on this cell after that. When the writing to the cell for storing the data "00" is finished, the writing operation to the cells connected to this word line is completed. Since a data erase operation usually resets the cells to the state having the data "11", the data write operation skips the writing to the cell for storing the data "11".

FIG. 7 is a block diagram schematically showing a conventional data write circuit configuration for multilevel nonvolatile semiconductor memory. In the configuration shown in FIG. 7, the nonvolatile semiconductor memory has cell array architecture. The address of each cell is selected by a X-decoder 21 and a Y-decoder 19. A data writing control circuit 100 is encircled with a dotted line in FIG. 7. The data writing control circuits 100 are provided to be of the same number as the memory cells in which writing or reading is performed at the same time. The memory cells 15 where writing or reading is simultaneously performed are selected by the X-decoder 21 and the Y-decoder 19. Data writing or data reading is performed on each of the selected memory cells 15 by the operation of each data writing control circuit 100 connected to each cell through the Y-decoder 19.

Each data writing control circuit 100 includes an I/O buffer 11 for inputting the write data specified by a user to the nonvolatile semiconductor memory cell 15 connected to the data writing control circuit 100 via the X-decoder 21 and the Y-decoder 19 and outputting to the outside the stored data read out of the nonvolatile semiconductor memory cell 15 by the read operation. It also includes a data register 12 for holding the write data from the I/O buffer 11 and outputting the write data as expected level data, and a write circuit 13 for conducting writing into the nonvolatile semiconductor memory cell 15 according to the expected level data. Also included is a sense amplifier 14 for reading out a write level state of the nonvolatile semiconductor memory cell 15, a MLC decoder 16 for decoding the write level of the memory cell read out by the sense amplifier 14, and a compare circuit 17 for comparing the data decoded by the MLC decoder 16 with the expected level data retained in the data register 12 and outputting a verification result.

An address buffer 50 outputs address information of the memory cell where data writing or reading is to be performed to the X-decoder 21 and the Y-decoder 19. A power unit 20 supplies a predetermined word voltage and source voltage according to each operation to a word line and a source line, respectively, to which the nonvolatile semiconductor memory cell 15 is connected so as to perform data write, read, or erase operation on the nonvolatile semiconductor memory cell 15.

A reference current generator 40 switches between a reference current for verification in data writing and a reference current in data reading from the memory where multilevel data is written according to each read operation, and outputs either current to the sense amplifier 14.

If the sense amplifier 14 corresponds to each bit line, the writing can be performed per word line. In this case, the same number of the data writing control circuits 100 as the number of the memory cells connected to one word line are provided, which undesirably makes the chip size larger. Thus, the number of the sense amplifiers 14 is usually set equal to the number of the memory cells from which data is read out in parallel in the data read operation on the nonvolatile semiconductor memory. Further, the number of the memory cells to which data is written at the same time, which is, the number of the data writing control circuits 100, is also set equal to the number of the sense amplifiers 14. The memory cells 15 on which writing are performed is selected by the X-decoder 21 and the Y-decoder 19.

FIG. 8 is a block diagram showing a conventional write circuit configuration where the write circuit configuration shown in FIG. 7 is applied to the nonvolatile semiconductor memory having the memory cell 15 able to store four-level (two-bit) data.

In the configuration shown in FIG. 8, when performing verification in data writing, the sense amplifier $14_2$ to $14_4$ output a signal that changes from "H" to "L" (or "L" to "H") when a write level state of the nonvolatile semiconductor memory cell 15 exceeds the expected level $LV_2$, $LV_3$, and $LV_4$, respectively, that is, when the current falls equal to or below the reference current level $I_{R2}$, $I_{R3}$, and $I_{R4}$, respectively. Further, though not shown, there is provided a data erase circuit having a sense amplifier for detecting the expected level $LV_1$ to control a data erase operation so that it resets the cells to the state that all the cells have the expected level $LV_1$ (data "11") when data is erased.

The compare circuit 17 outputs "FAIL" if the write level of the expected level data retained in the data register 12 is higher than the write level of the read data output from the MLC decoder 16, or "PASS" if the write level of the expected level data is equal to or lower than the write level of the read data.

FIG. 9 shows the distribution of the $I_D$-$V_G$ characteristics of the nonvolatile semiconductor memory cell where one of four levels is written by the data writing control circuit 100 shown in FIG. 8. A conventional data write operation will be explained hereinafter with reference to FIGS. 8 and 9.

Prior to the write operation, an erase operation is performed by an erase circuit (not shown) to erase previous data stored in the nonvolatile semiconductor memory cell 15. All the memory cells in the nonvolatile semiconductor memory device thereby have the expected level $LV_1$ (stored data "11"). The write operation is then started, inputting write data for each memory cell from each I/O buffer 11 to the data register 12. The data register 12 retains the write data as expected level data and outputs it to the write circuit 13.

If the expected level data from the data register 12 is "11", the write circuit 13 does not perform the write operation on the corresponding memory cell 15 since writing is already completed there. On the other hand, if the expected data from the data register 12 is "10", "01", or "00", the write circuit 13 performs the write operation on the corresponding memory cell 15 for a given period of time (about several hundreds of seconds), injecting electrons into the floating gate of this nonvolatile semiconductor memory cell 15.

Next, the read operation for verification (verify-read operation) is performed on the memory cell 15. If the current read out of the memory cell 15 is greater than the reference current $I_{R2}$, all of the sense amplifiers $14_2$ to $14_4$ output "H", and the MLC decoder 16 outputs the read data "11". As a result, while the compare circuit 17 for the memory cell 15 with the expected level data "11" outputs the verification result "PASS", the compare circuit 17 for the memory cell 15 whose expected level data output from the data register 12 is "10", "01", or "00" outputs "FAIL". Thus, the write cycle on this memory cell 15 is performed again.

The threshold level of the memory cell 15 increases with each write cycle. At the point when the current read out of the memory cell 15 falls equal to or below the reference current $I_{R2}$, the output from the sense amplifier $14_2$ becomes "L". Thus, the outputs from the sense amplifiers $14_2$, $14_3$, and $14_4$ are now "L", "H", and "H", respectivelly, and hence the MLC decoder 16 outputs the read data "10". The verification result in the compare circuit 17 connected with the memory cell 15 whose expected level data retained in the data register 12 is "11" or "10" thereby becomes "PASS".

The "FAIL" or "PASS" result is sent also to the data register 12. Upon receiving the "PASS" result from the compare circuit 17, the data register 12 changes the stored expected level data into "11". Thus, the expected level data "11" is input to the write circuit 13 for the memory cell 15 whose expected level data has been "10". The memory cell 15 is now in a writing completion status, and no write operation is performed there after that.

On the other hand, in the write circuit for the memory cell whose expected level data output from the data register 12 is "01" or "00", the verification result is still "FAIL", and hence the write cycle on the relevant memory cell 15 is performed again. The write cycle is repeated in this manner, and data writing is completed then on the memory cell with the expected level data "01", and finally on the memory cell with the expected level data "00".

FIG. 9 shows the $I_D$-$V_G$ characteristics of the nonvolatile semiconductor memory cell into which one of four levels is written by the data writing control circuit 100. As shown therein, variation in the $I_D$-$V_G$ characteristics of each cell becomes larger with the distance away from a verification determination point indicated by a circle in FIG. 9. In order to prevent a read margin from decreasing in the data read operation due to this variation, a word voltage $V_W$ in the verification operation and a word voltage $V_W$ in reading out data from the memory are set at the same level $V_W 1$. A data readout determination point indicated by a triangle in FIG. 9 from the memory storing multilevel data is set at a midpoint between the verification points indicated by circles in FIG. 9.

Further, the expected levels $LV_1$, $LV_2$, $LV_3$, and $LV_4$ and the readout word voltage $V_W 1$ are determined considering the condition for keeping all the memory cells 15 to which data is written in the enhancement state, and the disturb characteristics of the memory cells.

If the memory cell 15 is in a depression state during the data writing, the current can flow also from a non-accessed memory cell on the same bit line, interfering with accurate reading of the current level (data level) from the accessed memory cell. Thus, a write level to the memory cell 15 is set at the level that the writing to the memory cell 15 is always in the enhancement state to allow an output current from a non-accessed memory cell on the same bit line to be always zero.

A positive word voltage $V_W$ is applied to a control gate when reading data from the memory. Due to this readout word voltage $V_W$, the electrons injected into the floating gate in the data write operation can be slightly drawn to the control gate. This causes the stored data to be lost as the number of data reading increases, called cell disturb characteristics. Thus, the word voltage $V_W 1$ in the data writing is preferably not very large.

As is obvious from the distribution of the $I_D$-$V_G$ characteristics of the nonvolatile semiconductor memory cell shown in FIG. 9, the higher is the expected level $LV_1$, the larger is the variation of the threshold level of the memory cell 15 where the $LV_1$ is written, causing the memory cell 15 subject to be in the depression state. Further, if the readout word voltage $V_W$ 1 is too large, the disturb in the read operation can have serious adverse affects.

For the above reasons, the readout word voltage $V_W$ 1 and the reference current $I_{R1}$ of the expected level $LV_1$ are determined in consideration of the disturb characteristics of the memory cell 15 and the condition for keeping the memory cell in the enhancement state. All the memory cells 15 are reset to have the expected level $LV_1$ by the memory cell data erase operation. The lower level is appropriately divided so as to save a read margin in the most effective manner.

Generally, the readout word voltage $V_W$ 1 is determined by a voltage range used for the word voltage $V_W$ of the memory cell 15 on the basis of disturb consideration, the maximum current of the memory cell 15, and the condition for preventing the memory cell 15 from being in the depression state. The current corresponding to the above voltage is then (N−1) divided, thereby ensuring the read margin.

The read margin in the nonvolatile semiconductor memory cell where one of four levels is written increases with the difference between the reference current $I_{R1}$ for the expected level $LV_1$ in the memory cell with the lowest threshold level (the cell in a data erased state), and the reference current $I_{R4}$ for the expected level $LV_4$ in the memory cell with the highest threshold level. It is thus preferred that the reference current $I_{R1}$ of the expected level $LV_1$ is the highest possible while the reference current $I_{R4}$ of the expected level $LV_4$ is the lowest possible.

Increasing the reference current $I_{R1}$ for the expected level $LV_1$ requires increasing the readout word voltage $V_W$ 1. The readout word voltage $V_W$ 1, however, is determined by the restriction of the disturb characteristics of the memory cell and the condition for keeping the memory cell in the enhancement state and preventing it from being in the depression state as described above. It is thus unable to increase the readout word voltage $V_W$ 1 as desired.

Given the above restriction, conventional techniques set the smallest possible reference current $I_{R4}$ for the expected level $LV_4$ to create a large difference between the reference current $I_{R1}$ for the expected level $LV_1$ and the reference current $I_{R4}$ for the expected level $LV_4$. Each write level (the expected levels $LV_1$, $LV_2$, $LV_3$, and $LV_4$) is then determined so as to create a read margin most effectively.

On the other hand, reducing the reference current $I_{R4}$ for the expected level $LV_4$ causes reduction in the sensitivity of the sense amplifier $14_4$ to which the reference current $I_{R4}$ is input. Thus, if the reference current $I_{R4}$ for the expected level $LV_4$ is too small, it may cause indeterminate sensing in the verify operation. There is thus a problem that the reference current $I_{R4}$ for the expected level $LV_4$ is restricted by the sensitivity of the sense amplifier $14_4$.

SUMMARY OF THE INVENTION

An object of the present invention is to provide a method for enabling to have the largest possible margins in data reading and preventing indeterminate sensing at a verify operation in data writing.

Another object of the present invention is to provide a method for preventing undesirable stop of a write operation.

To these ends, according to one aspect of the present invention, there is provided a data writing method of a nonvolatile semiconductor memory device to reprogrammable nonvolatile semiconductor memory for storing N (N≧3) level of multilevel data by repeating a verification cycle of a write operation, a verify-read operation, and a compare operation until a write threshold level to a nonvolatile semiconductor memory cell exceeds a write level corresponding to an expected level. The method includes the steps of invalidating a verification result of a memory cell where a Nth threshold level which is a highest level is to be written as an expected level by mandatorily setting the verification result to "FAIL" until completion of writing to a memory cell where a (N−1)th and lower threshold level is to be written; and validating a verification result of the memory cell where the Nth level is to be written after reaching the (N−1)th write level.

According to another aspect of the present invention, there is provided a data writing method of a nonvolatile semiconductor memory device to reprogrammable nonvolatile semiconductor memory for storing N (N≧3) level of multilevel data by repeating a verification cycle of a write operation, a verify-read operation, and a compare operation until a write threshold level to a nonvolatile semiconductor memory cell exceeds a write level corresponding to an expected level. The method includes the steps of setting a word line voltage supplied for the verify-reading in verification of the (N−1)th and lower level data to a first word line voltage; and setting a word line voltage supplied for the verify-reading in verification of the Nth level data to a second word line voltage which is higher than the first word line voltage.

It is preferred in the above methods that a reference current supplied to a sense amplifier corresponding to the Nth threshold level which is a highest level as an expected level is set at at least a level allowing no indeterminate sensing of the sense amplifier, and a word line voltage supplied for the verify-reading in verification of the Nth level data is switched to a second word line voltage higher than a first word line voltage supplied in verification of the (N−1)th and lower level data.

Further, a write threshold level to the memory cell where the Nth level is to be written may be set at at least the first word line voltage.

It is also preferred that a reference current for verification supplied to the sense amplifier corresponding to the Nth level is set equal to a reference current supplied in data reading from the nonvolatile semiconductor memory storing multilevel data.

Furthermore, a verification result of the memory cell where (N−1)th and lower level data is to be written may be mandatorily set to "PASS" while a verification result of the Nth data is valid to stop a writing operation to the memory cell where (N−1)th and lower level data is written.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

FIG. 2A is a table showing the operational state of a compare circuit (CMP) according to an embodiment of the invention.

FIGS. 2B and 2C are tables showing the operational state of a selection signal generating circuit (CTL) according to an embodiment of the invention.

DESCRIPTION OF THE PREFERRED EMBODIMENTS

Figure 1:
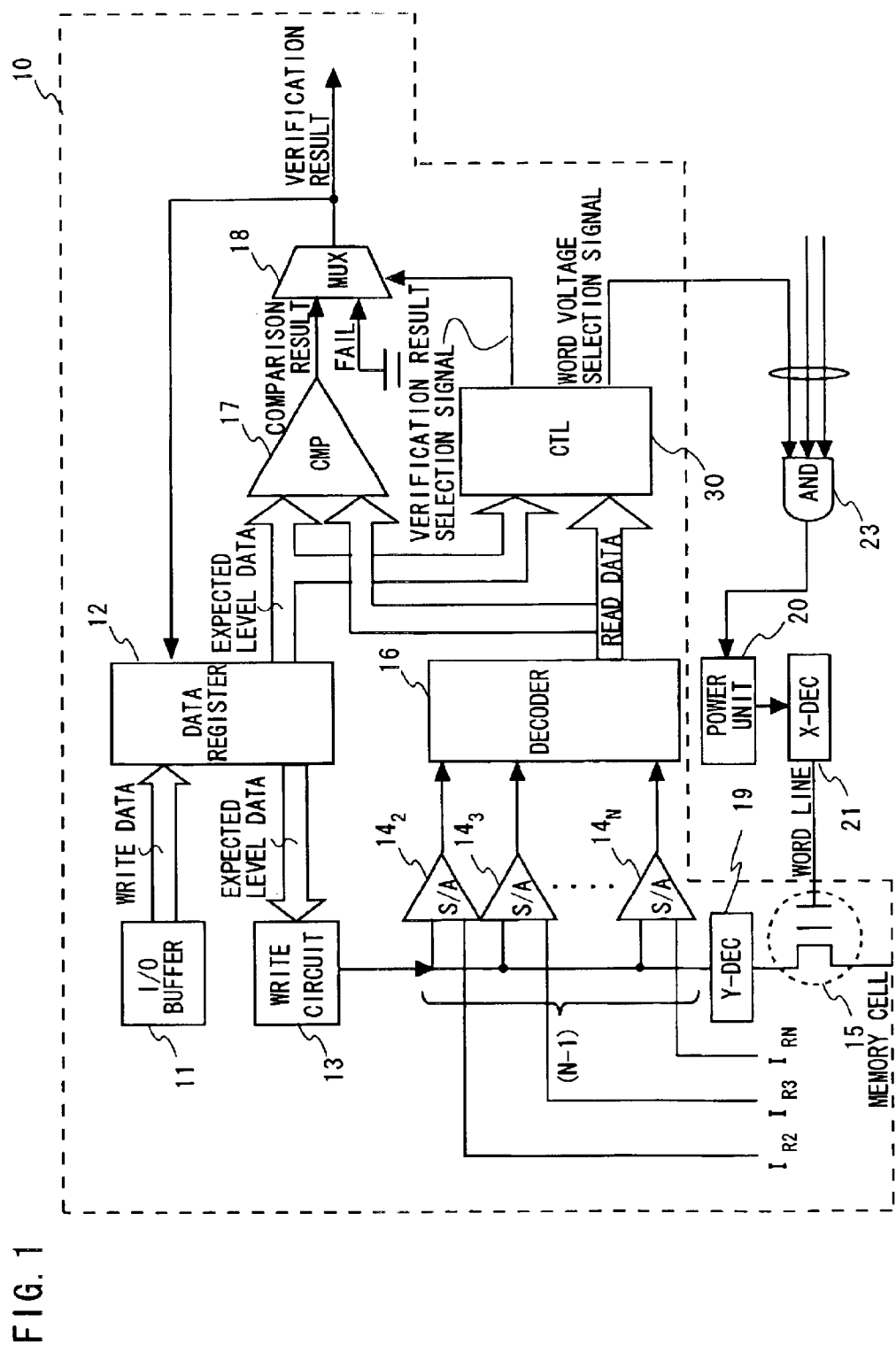
FIG. 1 is a block diagram showing an embodiment of a write circuit configuration for multilevel (N level) nonvolatile semiconductor memory according to an embodiment of the invention.
Figure 6:
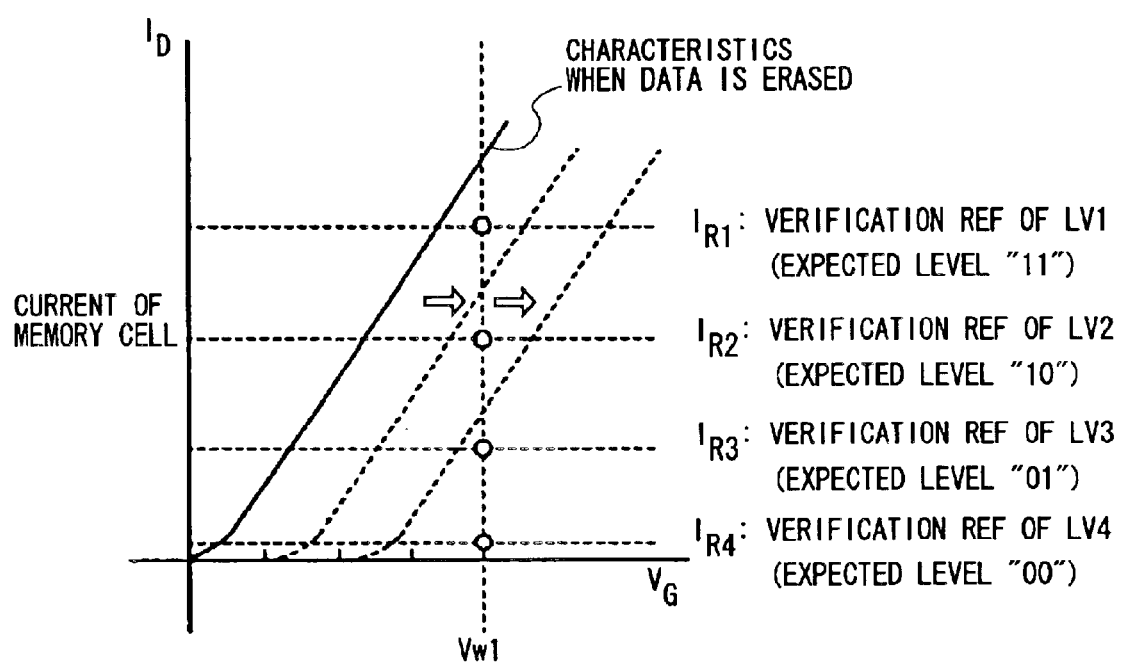
FIG. 6 is a schematic diagram showing changes in the $I_D$-$V_G$ characteristics of a programmable nonvolatile semiconductor memory cell during write operation.
Figure 7:
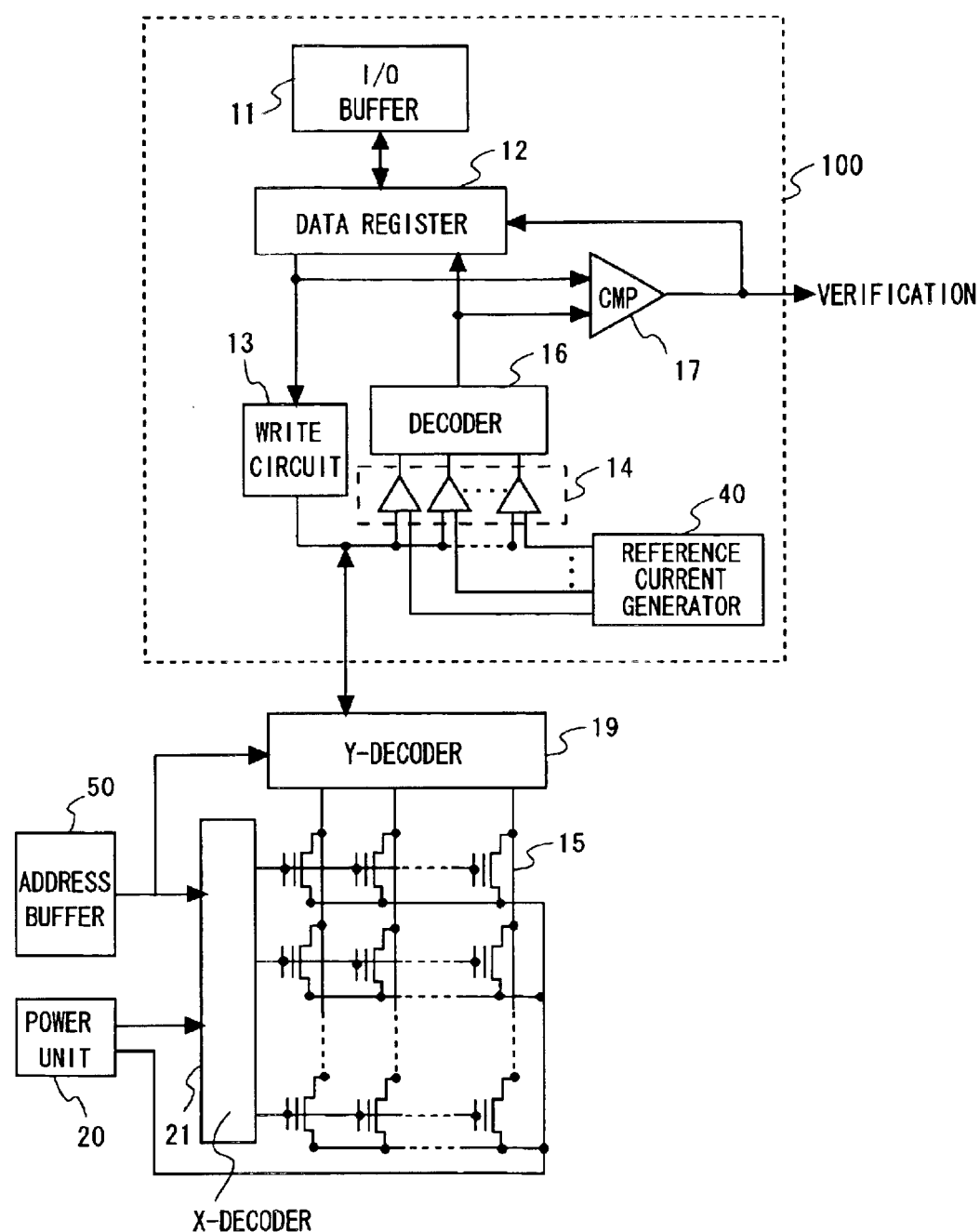
FIG. 7 is a block diagram showing a conventional write circuit configuration for multilevel nonvolatile semiconductor memory.
Figure 8:
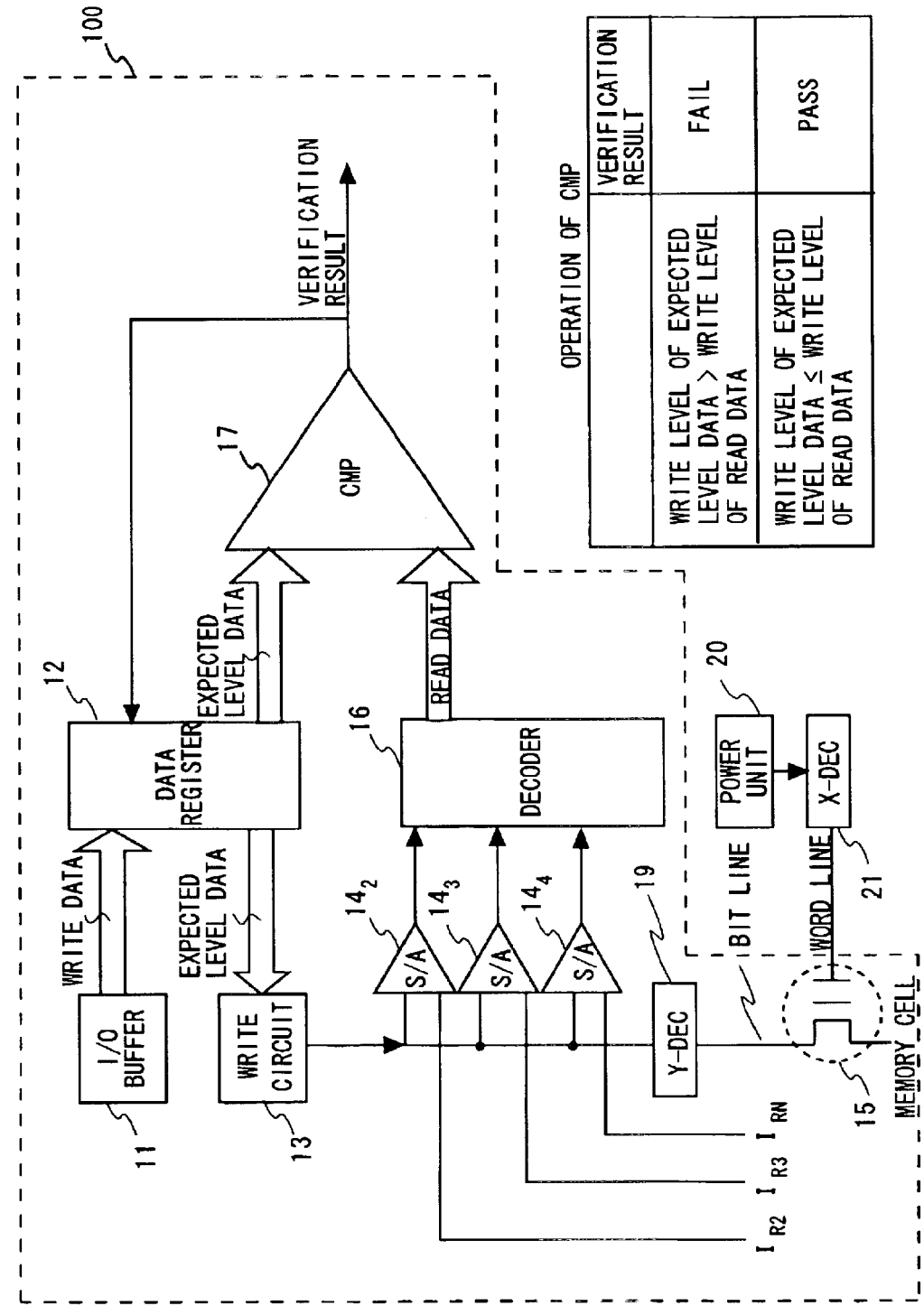
FIG. 8 is a block diagram showing a conventional write circuit configuration where the write circuit configuration shown in FIG. 7 is applied to nonvolatile semiconductor memory having a memory cell able to store four-level (two-bit) data.
Figure 9:
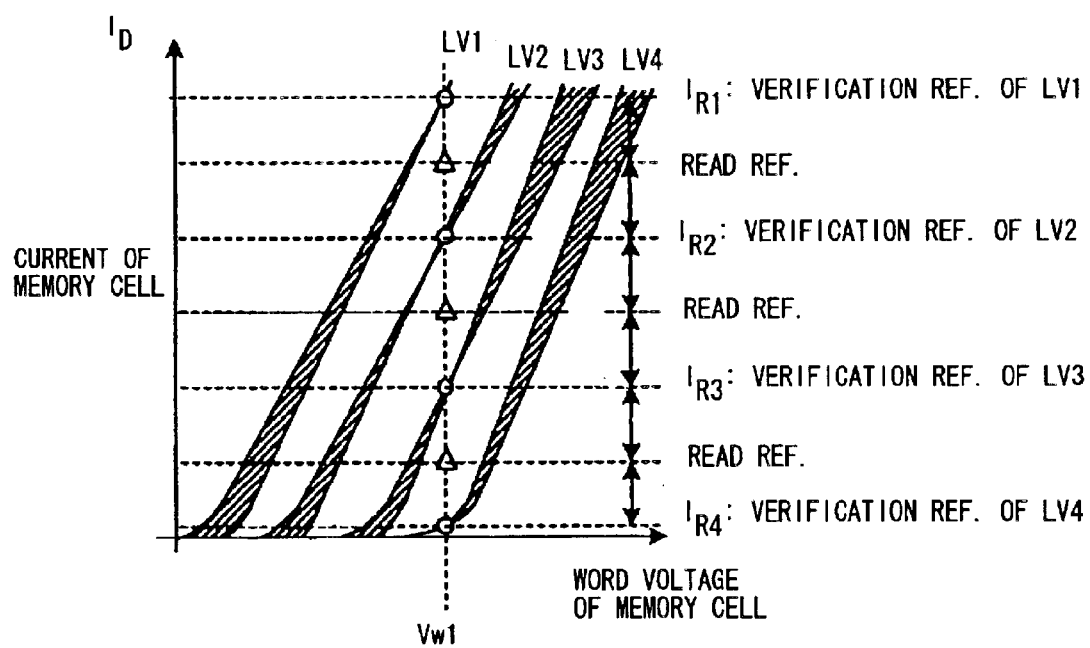
FIG. 9 is a diagram showing the distribution of $I_D$-$V_G$ characteristics of nonvolatile semiconductor memory cell where some level data is written by a data writing control circuit shown in FIG. 8.

Referring to FIG. 1, it shows a block diagram showing an embodiment of a write circuit configuration for multilevel (N level; N≧3) nonvolatile semiconductor memory according to an embodiment of this invention. The data writing control circuits 100 encircled with a dotted line are provided to be of the same number as the number of the memory cells to which writing is performed simultaneously, as is the case with the configuration shown in FIGS. 6 and 7.

Each data writing control circuit 10 includes an I/O buffer 11 for inputting the write data specified by a user to a nonvolatile semiconductor memory cell 15 and outputting the stored data read out of the memory cell by the read operation. It also includes a data register 12 for holding the write data from the I/O buffer 11 and outputting the write data as expected level data, and a write circuit 13 for performing data writing to the nonvolatile semiconductor memory cell 15. Also included are sense amplifier $14_2$ to $14_N$ for reading out a write level state of the nonvolatile semiconductor memory cell 15, a MLC decoder 16 for decoding the write level of the memory cell 15 read out by the sense amplifier $14_2$ to $14_N$, and a compare circuit (CMP) 17 for comparing the data decoded by the MLC decoder 16 with the expected level data retained in the data register 12 and outputting a verification result. The data writing control circuit 10 further includes a selection circuit (multiplexer: MUX) 18 for selecting between an output from the compare circuit 17 and a value indicating "FAIL" or "PASS", and outputting either one as a verification result.

If once the verification of a memory cell has resulted in "PASS", the data register 12 outputs the expected level $LV_1$ corresponding to the least threshold level for this memory cell. By this function, when a word voltage for verification becomes $V_W 2$ (the second word line voltage), the verification result of the memory cells with $LV_{N-1}$ or lower level data where writing has been completed is mandatorily set to "PASS".

Reference current $I_{R2}$ to $I_{RN}$ for verification for detecting the write level state $LV_2$ to $LV_N$, respectively, are input to the sense amplifier $14_2$ to $14_N$ for reading out the write level state of the nonvolatile semiconductor memory cell 15. In this embodiment, the reference current $I_{RN}$ input to the sense amplifier $14_N$ for the memory cell where the Nth threshold level which is the highest level is to be written as an expected level is set higher than a conventional reference current $I_{RN}$ for verification. For example, it is set equal to the reference current in reading data from the nonvolatile semiconductor memory storing multilevel data.

A power unit 20 supplies a predetermined word voltage according to each operation to the word line to which the nonvolatile semiconductor memory cell 15 selected by a X-decoder 21 is connected to perform data write, read, or erase operation on the nonvolatile semiconductor memory cell 15. In this embodiment, a verify-read voltage ($V_W$) supplied from the power unit 20 is switched between the level equal to the word voltage in the data read operation (the first word line voltage $V_W 1$) and the level larger than $V_W 1$ (the second word line voltage $V_W 2$) and controlled by a selection signal generating circuit (CTL) 30 and an AND gate 23.

The selection signal generating circuit (CTL) 30 outputs a word voltage selection signal for selecting the word voltage to be supplied to the memory cell in verification. The signal is sent to the power unit 20 via the AND gate 23. Specifically, the selection signal generating circuit (CTL) 30 monitors the expected level data written to the memory cell 15 and the read data read out of the memory cell 15. If the expected level data of the memory cell 15 is in the range between $LV_2$ and $LV_{N-1}$, or until the read data from the memory cell 15 with the expected level data $LV_N$ reaches $LV_{N-1}$, the selection signal generating circuit (CTL) 30 outputs a control signal "L" for selecting the first word voltage $V_W 1$ as a word voltage for the memory cell in verification.

On the other hand, if the expected level data of the memory cell 15 is $LV_1$, or after the read data from the memory cell 15 with the expected level data $LV_N$ has reached $LV_{N-1}$, the selection signal generating circuit (CTL) 30 outputs a control signal "H" for selecting the second word voltage $V_W 2$ as a word voltage for the memory cell in verification. The AND gate 23 outputs a signal for switching the word voltage from $V_W 1$ to $V_W 2$ to the power unit 20 when all the signals from the selection signal generating circuits (CTL) 30 for the memory cells 15 where writing is performed simultaneously become the control signals "H" for selecting the second word voltage $V_W 2$.

The selection signal generating circuit (CTL) 30 also outputs to the selection (MUX) circuit 18 a control signal for selecting between outputting a compare result of the compare circuit 17 or mandatorily outputting a value indicating "FAIL" (or, either "FAIL" or "PASS") as a verification result.

The compare circuit 17 outputs "FAIL" if the write level of the expected level data is higher than the write level of the read data or "PASS" if the write level of the expected level data is equal to or lower than the write level of the read data. The result is sent to the selection circuit (MUX) 18.

The selection circuit (MUX) 18 mandatorily sets the verification result of the $LV_N$ memory cell to "FAIL" by selecting a "FAIL" signal while the word voltage selection signal indicates the first word voltage $V_W 1$ by the control signal from the selection signal generating circuit (CTL) 30. Once the word voltage selection signal indicates the second word voltage $V_W 2$, the selection circuit (MUX) 18 cancels the mandatory FAIL setting in verification of the $LV_N$ memory cell and determines "PASS" or "FAIL" based on whether the read data from the memory cell exceeds $PV'_N$ by selecting the output from the CMP 17.

Figure 3:
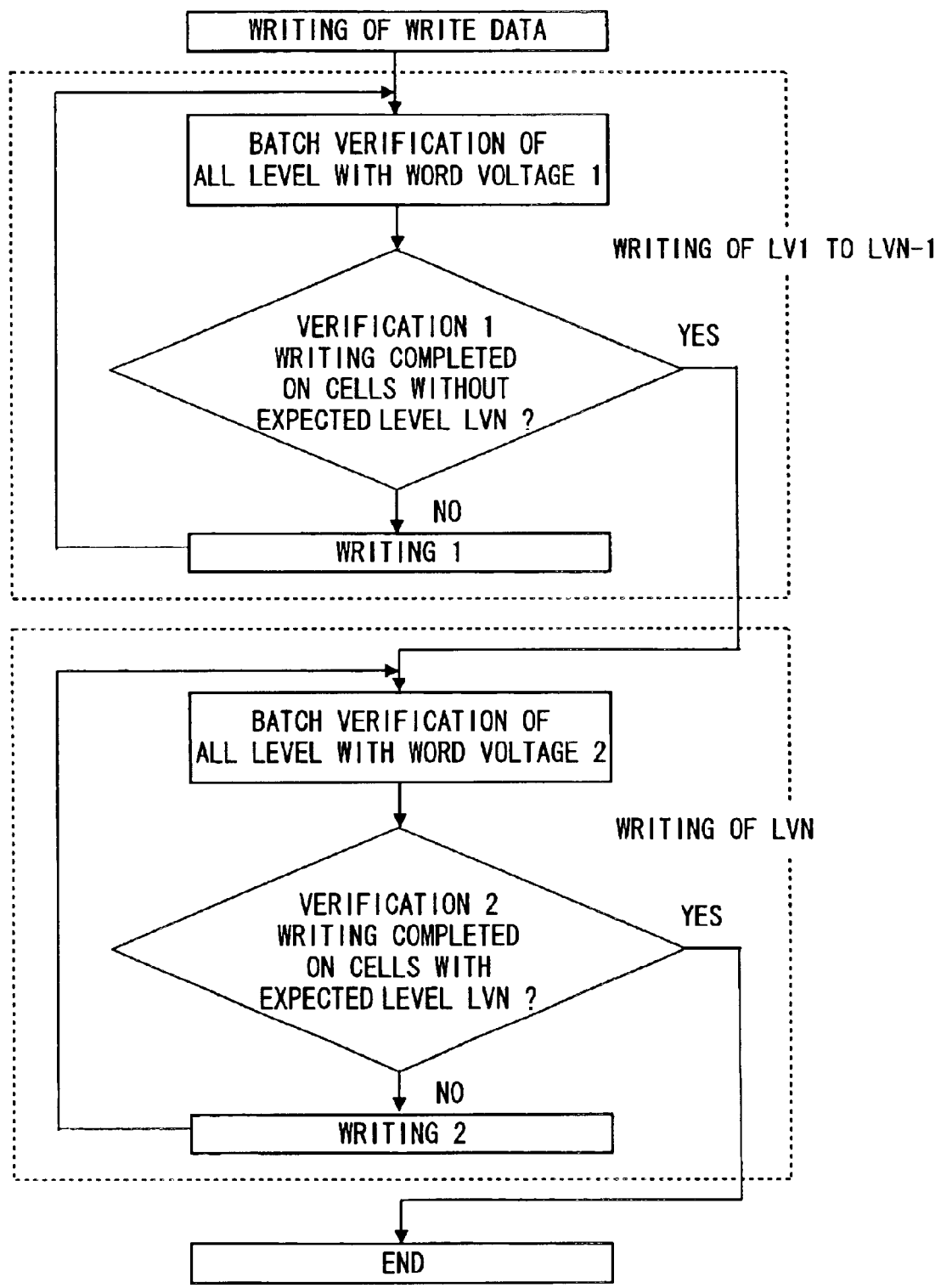
FIG. 3 is a flowchart showing an automatic write sequence according to an embodiment of the invention.
Figure 4:
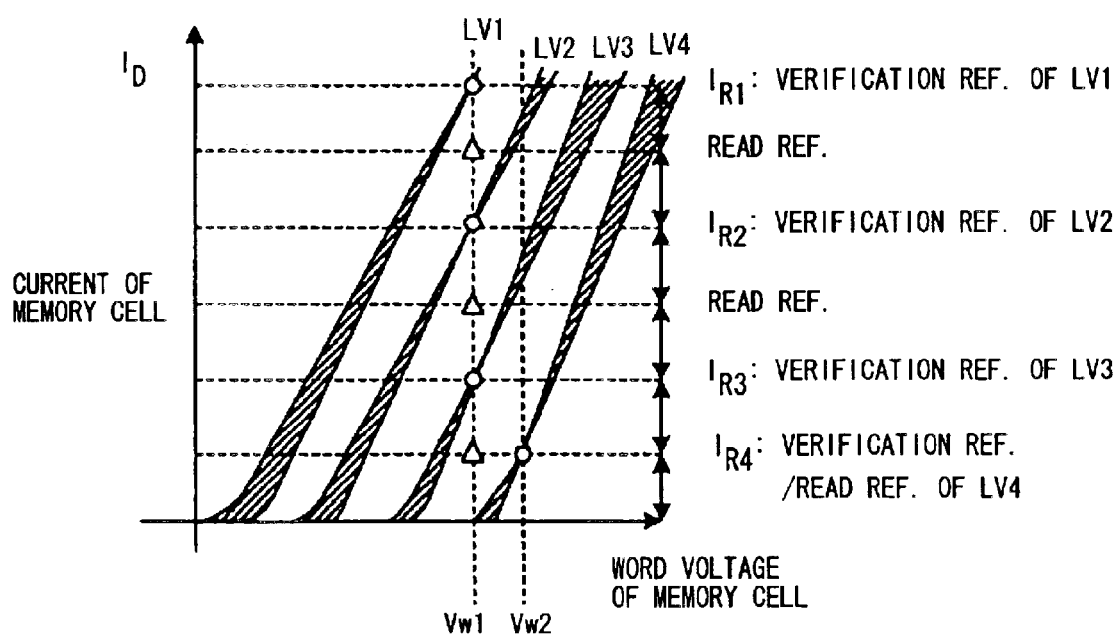
FIG. 4 is a diagram showing the distribution of $I_D$-$V_G$ characteristics of a nonvolatile semiconductor memory cell where some level data is written by a data writing control circuit according to an embodiment of the invention.
Figure 5:
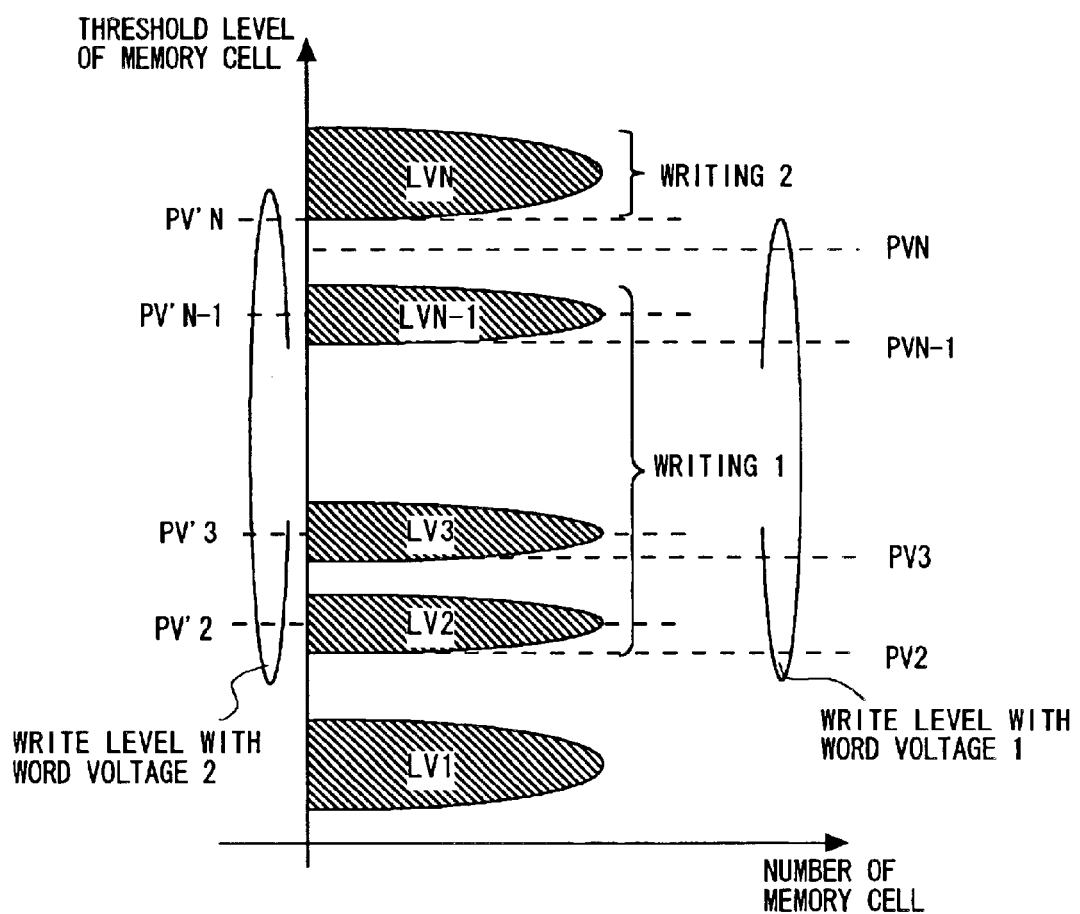
FIG. 5 is a diagram showing a multilevel threshold distribution and a write verification level according to an embodiment of the invention.

FIG. 2A is the table showing the operational state of the compare circuit (CMP) 17, and FIGS. 2B and 2C are the tables showing the operational state of the selection signal generating circuit (CTL) 30 in this embodiment. FIG. 3 is a flowchart showing an automatic write sequence in this embodiment. FIG. 4 shows an example of switching a word voltage and a reference current in writing one of four levels into the nonvolatile semiconductor memory cell 15 with the data writing control circuit 10 in this embodiment. FIG. 5 shows a multilevel threshold distribution and a write verification level in this embodiment.

As shown in FIGS. 3 and 5, the verification on the memory cell where the Nth threshold level which is the highest level is to be written as an expected level is performed separately from the verification on the memory cell where the (N−1)th or lower threshold level is to be written in this embodiment. The operation according to this embodiment will be explained hereinafter with reference to FIGS. 1 to 5.

Prior to a write operation, an erase operation is performed to erase previous data stored in all the memory cells 15 in the nonvolatile semiconductor memory device. All the memory cells 15 are thereby reset to the state with the expected level $LV_1$ (the expected level "11" if using four-level data). Once the write operation starts, write data for each memory cell is input to the data register 12 from each I/O buffer 11. The data register 12 retains the write data as expected level data and outputs it to the write circuit 13.

If the expected level data from the data register 12 is $LV_1$, the write circuit 13 performs no write operation on the corresponding memory cell 15 since the write operation has been completed there. On the other hand, if the expected level data from the data register 12 is $LV_2$ to $LV_N$, the write circuit 13 performs write operation on the corresponding memory cell 15 for a given period of time (about several hundreds of seconds), injecting electrons into the floating gate of the corresponding nonvolatile semiconductor memory cell 15.

Next, a read operation on the memory cell 15 for verification (verify-read operation) is performed. Here, a control signal "L" for selecting the first word voltage $V_W 1$ as a word voltage supplied for the memory cell when performing verification is output from the selection signal generating circuit (CTL) 30. Thus, the AND gate 23 controls the word voltage supplied from the power unit 20 so that it equals the word voltage $V_W 1$ (the first word voltage) in a normal data read operation.

Further, the selection signal generating circuit (CTL) 30 controls the selection circuit (MUX) 18 so that the verification result output from the selection circuit (MUX) 18 connected to the memory cell with the expected level data $LV_N$ is mandatorily set to "FAIL", while the verification result output from the selection circuit (MUX) 18 connected to the memory cell with the expected level data different from $LV_N$ is the compare result of the compare circuit 17.

If the current read out of the memory cell 15 is equal to or higher than the reference current $I_{R2}$, all the outputs from the sense amplifier $14_2$ to $14_{N-1}$ and the sense amplifier $14_N$ are "H", and hence the MLC decoder 16 outputs the read data "11 . . . 1" ($LV_1$). As a result, the verification in the compare circuit 17 corresponding to the memory cell whose expected level data output from the data register 12 is any of $LV_2$ to $LV_N$ results in "FAIL". Thus, the write cycle on this memory cell 15 is performed again.

In this embodiment, the verification result of the memory cell 15 whose expected data output from the data register 12 is $LV_N$ is mandatorily set to "FAIL" regardless of the verification result in the compare circuit 17 until the writing to the memory cell 15 with the expected data $LV_{N-1}$ is completed for the reasons described later.

Repeating the write cycle increases the threshold level of the memory cell 15. At the point when the current read out of the memory cell 15 falls equal to or below the reference current $I_{R2}$, the output from the sense amplifier $14_2$ becomes "L". The MLC decoder 16 thereby outputs the read data $LV_2$, and the verification result in the compare circuit 17 for the memory cell 15 whose expected level data retained in the data register 12 is $LV_2$ becomes "PASS". The "PASS" data is sent also to the data register 12. Upon receiving the "PASS" data, the data register 12 changes the stored expected level data $LV_2$ into $LV_1$.

From then on, the expected level data $LV_1$ is input to the write circuit 13 for the memory cell 15 whose expected data has been $LV_2$. Thus, this write circuit 13 performs no write operation. On the other hand, in the write circuit for the memory cell whose expected level data output from the data register 12 is $LV_3$ to $LV_{N-1}$, the verification result from the compare circuit 17 is "FAIL". Further, the verification result of the memory cell with the expected level data $LV_N$ is mandatorily set to "FAIL". Thus, the write cycle on these memory cells 15 is performed again.

The expected level data $LV_1$ is sent also to the selection signal generating circuit (CTL) 30 connected to the corresponding memory cell 15. Thus, the selection signal generating circuit (CTL) 30 connected to the memory cell 15 storing the expected level data $LV_2$ outputs a control signal "H" for selecting the second word voltage $V_W 2$ as a word voltage supplied for the memory cell in verification. On the other hand, the selection signal generating circuit (CTL) 30 connected to the memory cell whose expected data is $LV_3$ to $LV_{N-1}$ outputs a control signal "L" for selecting the first word voltage $V_W 1$ as a word voltage supplied for the memory cell in verification. Thus, the AND gate 23 controls the word voltage supplied from the power unit 20 so that it equals the word voltage $V_W 1$ (the first word voltage) in a normal data read operation. The write cycle is repeated in this manner, which sequentially completes the data writing to the memory cells with the expected level data up to $LV_{N-1}$.

The reference current $I_{RN}$ input to the sense amplifier $14_N$ for the memory cell where Nth level data with the highest threshold level is to be written as an expected level is set higher than a conventional reference current $I_{RN}$ for verification. For example, it is set equal to the reference current for normal data reading. There is thus a risk that the current read out of the memory cell 15 with the expected level data $LV_N$ falls equal to or below the reference current $I_{RN}$ during the data write operation into the memory cell with the expected level data $LV_{N-1}$ due to variation in the memory cells and so on.

Therefore, if the same verification as that performed on the memory cell with the expected level data $LV_{N-1}$ or lower is performed on the memory cell 15 with the expected level data $LV_{N-1}$, an output from the sense amplifier $14_N$ connected to the memory cell 15 with the expected level data $LV_N$ where the current falls equal to or below the reference current $I_{RN}$ becomes "L". The verification result in the compare circuit 17 thereby becomes "PASS". As a result, the expected level data of this memory cell retained in the data register 12 may be rewritten into $LV_1$, which can undesirably stop the subsequent write operation.

To avoid this, in this embodiment, during the data writing into the memory cells with the expected level data up to $LV_{N-1}$, the selection signal generating circuit (CTL) 30 connected to the memory cell 15 whose expected data output from the data register 12 is $LV_N$ controls the selection circuit (MUX) 18 so that it mandatorily outputs "FAIL" regardless of the verification result in the compare circuit 17.

Upon completion of the data writing into the memory cells with the expected level data up to $LV_{N-1}$, all the expected level data retained in the data registers 12 connected to the memory cells with the write data $LV_1$ to $LV_{N-1}$ is rewritten into $LV_1$. Further, the read data from the memory cell with the write expected level data $LV_N$ becomes $LV_{N-1}$. Thus, all the selection signal generating circuits (CTL) 30 output a control signal "H" for selecting the second word voltage $V_W 2$ as a word voltage supplied for the memory cell in verification. The AND gate 23 thereby outputs the signal for switching the word voltage from $V_W 1$ to $V_W 2$.

Thus, at the point when the process proceeds to the write cycle on the memory cell with the expected level data $LV_N$ only, the word voltage supplied from the power unit 20 in the read operation of the memory cell 15 for verification (the verify-read operation) is switched into the second word voltage $V_W 2$ which is higher than the first word voltage $V_W 1$ in a normal data read operation.

Then, the write cycle is repeated only on the memory cell 15 with the expected level data $LV_N$ until the read current falls equal to or below the reference current $I_{RN}$ ($I_{R4}$ in the case of using four-level data). At the point when the read current falls equal to or below the reference current $I_{RN}$ ($I_{R4}$ when using four-level data), the writing to the memory cell 15 with the expected level data $LV_N$ is completed. The writing of the multilevel data to the nonvolatile semiconductor memory device is thereby completed.

In this embodiment of the invention, the reference current $I_{RN}$ ($I_{R4}$ in the case of using four-level data) input to the sense amplifier $14_N$ in verification is set equal to the reference current supplied for data reading when used as nonvolatile semiconductor memory after the storing of the multilevel data is completed. This is for the purpose of simplifying a current setting circuit by sharing the reference current $I_{RN}$ in both reading. It is, however, not necessary to share the current, and any current level may be selected so that the sensitivity of the sense amplifier $14_N$ in verification is equal to or more than a desired level.

Further, in this embodiment, the verification result of the memory cell 15 whose expected data output from the data register 12 is $LV_N$ is mandatorily set to "FAIL" regardless of the verification result in the compare circuit 17 until completion of the writing to the memory cell 15 with the expected data $LV_{N-1}$. However, if the variation in the memory cells and so on is small and there is no risk that the current read out of the memory cell 15 with the expected level data $LV_N$ falls equal to or below the reference current $I_{RN}$ during the data write operation on the memory cell with the expected level data $LV_{N-1}$, means for mandatorily setting the verification result of the memory cell 15 with the expected data $LV_N$ to "FAIL" may be omitted.

This embodiment enables the threshold level of the memory cell 15 with the expected level data $LV_N$ to be set higher than the word voltage (the first word voltage $V_W 1$) in a normal data read operation. This allows setting a lower level of the reference current $I_{RN}$ for the sense amplifier $14_N$ in a normal data read operation. It is thus possible to have a large margin in the read operation, thereby enhancing high-speed reading.

By switching the word voltage in the verify-read operation from $V_W 1$ to $V_W 2$ which is a higher level, the current read out of the memory cell with the expected level data $LV_1$ or $LV_2$ can become equal to or higher than the reference current level $I_{R1}$ for the memory cell with the expected level data $LV_1$. The output from the sense amplifier 142 can thereby become "H", and thus the verification in the compare circuit 17 for the memory cell 15 with the expected level data $LV_1$ or $LV_2$ can undesirably result in "FAIL". However, since the expected level data in the data register 12 connected to such a memory cell is already rewritten into $LV_1$, there is no risk that writing is performed thereon.

To prevent that the verification in the compare circuit 17 for the memory cell 15 with the expected level data $LV_1$ or $LV_2$ results in "FAIL", the compare result of the memory cell 15 whose expected data input to the compare circuit 17 from the data register 12 is $LV_1$ may be mandatorily set to "PASS".

It is also possible that, after the process proceeds to the verification of the memory cell 15 with the expected level data $LV_N$, the selection signal generating circuit (CTL) 30 controls the selection circuit (MUX) 18 so that the verification result output from the selection circuit (MUX) 18 connected to the memory cell 15 whose expected level data is equal to or lower than $LV_{N-1}$ is mandatorily set to "PASS", while the verification result output from the selection circuit (MUX) 18 connected to the memory cell 15 whose expected level data is $LV_N$ is the same as the compare result of the compare circuit 17.

The present invention allows setting a high level of the reference current in the verify operation on the multilevel memory cell with a high threshold level to avoid indeterminate sensing in the verify operation. Further, it enables the write operation with a large margin in the read operation.

In addition, applying the function of this invention to a readout system performing batch verification of the write levels of N level data achieves high-speed reading while having a large margin in the read operation.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A data writing method of a nonvolatile semiconductor memory device to reprogrammable nonvolatile semiconductor memory for storing N (N≧3) level of multilevel data by repeating a verification cycle of a write operation, a verify-read operation, and a compare operation until a write threshold level to a nonvolatile semiconductor memory cell exceeds a write level corresponding to an expected level, comprising the steps of:

invalidating a verification result of a memory cell where a Nth threshold level which is a highest level is to be written as an expected level by mandatorily setting the verification result to "FAIL" until completion of writing to a memory cell where a (N−1)th and lower threshold level is to be written; and validating a verification result of the memory cell where the Nth level is to be written after reaching the (N−1)th write level.

2. A data writing method of the nonvolatile semiconductor memory device according to claim 1, wherein a reference current supplied to a sense amplifier corresponding to the Nth threshold level which is a highest level as an expected level is set at at least a level allowing no indeterminate sensing of the sense amplifier, and a word line voltage supplied for the verify-reading in verification of the Nth level data is switched to a second word line voltage higher than a first word line voltage supplied in verification of the (N−1)th and lower level data.

3. A data writing method of the nonvolatile semiconductor memory device according to claim 2, wherein a write threshold level to the memory cell where the Nth level is to be written is set at at least the first word line voltage.

4. A data writing method of the nonvolatile semiconductor memory device according to claim 2, wherein a reference current for verification supplied to the sense amplifier corresponding to the Nth level is set equal to a reference current supplied in data reading from the nonvolatile semiconductor memory storing multilevel data.

5. A data writing method of the nonvolatile semiconductor memory device according to claim 2, wherein a verification result of the memory cell where (N−1)th and lower level data is to be written is mandatorily set to "PASS" while a verification result of the Nth data is valid to stop a writing operation to the memory cell where (N−1)th and lower level data is written.

6. A reprogrammable nonvolatile semiconductor memory device for storing multilevel data, comprising
a power unit for supplying a predetermined word voltage to a word line to which a nonvolatile semiconductor memory cell is connected, capable of switching the word voltage between a first predetermined word line voltage and a second predetermined word line voltage higher than the first word line voltage;
a data writing control circuit for controlling data writing to the nonvolatile semiconductor memory cell, comprising:
an I/O buffer for inputting N (N≧3) level write data specified by a user to the nonvolatile semiconductor memory cell;
a data register for holding the write data from the I/O buffer and outputting the write data as expected level data;
a write circuit for performing data writing to the nonvolatile semiconductor memory cell;
(N−1) number of sense amplifiers for reading out a write level state of the nonvolatile semiconductor memory cell;
a decoder for decoding a write level of the memory cell read out by the sense amplifiers;
a compare circuit for comparing data decoded by the decoder with the expected level data retained in the data register and outputting a verification result;
a selection circuit for selecting between an output from the compare circuit and an output for mandatorily setting a verification result to "FAIL", and outputting a selected one as a verification result; and
a selection signal generating circuit for outputting to the selection circuit a control signal for mandatorily setting a verification result of a memory cell where a Nth threshold level which is a highest level is to be written as an expected level to "FAIL" until completion of writing to a memory cell where a (N−1)th and lower threshold level is to be written as an expected level and validating a verification result of the memory cell where the Nth level is to be written after reaching the (N−1)th write level, and outputting to the power unit a control signal for switching a word line voltage for verification between the first word line voltage in writing the (N−1)th and lower level and the second word line voltage in writing the Nth level; and
an array of nonvolatile semiconductor memory cells for storing one of N (N≧3) level data by repeating a verification cycle of a write operation, a verify-read operation, and a compare operation until a write threshold level to a nonvolatile semiconductor memory cell exceeds a write level corresponding to an expected level.

7. A nonvolatile semiconductor memory device for storing multilevel data according to claim 6, wherein a plurality of the data writing control circuits are provided for simultaneous writing of data to a plurality of the nonvolatile semiconductor memory cells, and the power unit is controlled by an output from an AND gate to which a control signal output from each selection signal generating circuit of the plurality of the data writing control circuits is input.

8. A nonvolatile semiconductor memory device for storing multilevel data according to claim 6, wherein a reference current supplied to a sense amplifier corresponding to the Nth threshold level which is a highest level as an expected level is set at at least a level allowing no indeterminate sensing of the sense amplifier.

9. A nonvolatile semiconductor memory device for storing multilevel data according to claim 8, wherein a reference current supplied to the sense amplifier corresponding to the Nth level is set equal to a reference current supplied in data reading from the nonvolatile semiconductor memory storing multilevel data.

10. A nonvolatile semiconductor memory device for storing multilevel data according to claim 6, wherein the data register has a function that rewrites expected level data retained therein into data for mandatorily setting a verification result to "PASS" upon receiving a "PASS" signal indicating completion of writing to the memory cell from the selection circuit.

11. A nonvolatile semiconductor memory device for storing multilevel data according to claim 6, comprising a unit for mandatorily setting a verification result of the memory cell where (N−1)th and lower level data is written to "PASS" while a verification result of the Nth data is valid.

12. A data writing method of a nonvolatile semiconductor memory device to reprogrammable nonvolatile semiconductor memory for storing N (N≧3) level of multilevel data by repeating a verification cycle of a write operation, a verify-read operation, and a compare operation until a write threshold level to a nonvolatile semiconductor memory cell exceeds a write level corresponding to an expected level, comprising the steps of:
setting a word line voltage supplied for the verify-reading in verification of the (N−1)th and lower level data to a first word line voltage; and
setting a word line voltage supplied for the verify-reading in verification of the Nth level data to a second word line voltage which is higher than the first word line voltage.

13. A data writing method of the nonvolatile semiconductor memory device according to claim 12, further comprising the steps of:
invalidating a verification result of a memory cell where a Nth threshold level which is a highest level is to be written as an expected level by mandatorily setting the verification result to "FAIL" until completion of writing to a memory cell where a (N−1)th and lower threshold level is to be written; and validating a verification result of the memory cell where the Nth level is to be written after reaching the (N−1)th write level.

14. A data writing method of the nonvolatile semiconductor memory device according to claim 12, wherein a reference current supplied to a sense amplifier corresponding to the Nth threshold level which is a highest level as an expected level is set at at least a level allowing no indeterminate sensing of the sense amplifier.

15. A data writing method of the nonvolatile semiconductor memory device according to claim 12, wherein a write threshold level to the memory cell where the Nth level is to be written is set at at least the first word line voltage.

16. A data writing method of the nonvolatile semiconductor memory device according to claim 12, wherein a reference current for verification supplied to the sense amplifier corresponding to the Nth level is set equal to a reference current supplied in data reading from the nonvolatile semiconductor memory storing multilevel data.

17. A data writing method of the nonvolatile semiconductor memory device according to claim 12, wherein a verification result of the memory cell where (N−1)th and lower level data is to be written is mandatorily set to "PASS" while a verification result of the Nth data is valid to stop a writing operation to the memory cell where (N−1)th and lower level data is written.

18. A reprogrammable nonvolatile semiconductor memory device for storing multilevel data, comprising a power unit for supplying a predetermined word voltage to a word line to which a nonvolatile semiconductor memory cell is connected, capable of switching the word voltage between a first predetermined word line voltage and a second predetermined word line voltage higher than the first word line voltage;

a data writing control circuit for controlling data writing to the nonvolatile semiconductor memory cell, comprising:

an I/O buffer for inputting N (N≧3) level write data specified by a user to the nonvolatile semiconductor memory cell;

a data register for holding the write data from the I/O buffer and outputting the write data as expected level data;

a write circuit for performing data writing to the nonvolatile semiconductor memory cell;

(N−1) number of sense amplifiers for reading out a write level state of the nonvolatile semiconductor memory cell;

a decoder for decoding a write level of the memory cell read out by the sense amplifiers;

a compare circuit for comparing data decoded by the decoder with the expected level data retained in the data register and outputting a verification result; and a selection signal generating circuit for outputting to the power unit a control signal for switching a word line voltage for verification between the first word line voltage in writing the (N−1)th and lower level and the second word line voltage in writing the Nth level; and an array of nonvolatile semiconductor memory cells for storing one of N (N≧3) level data by repeating a verification cycle of a write operation, a verify-read operation, and a compare operation until a write threshold level to a nonvolatile semiconductor memory cell exceeds a write level corresponding to an expected level.

* * * * *